United States Patent
Katsir et al.

(10) Patent No.: US 8,877,426 B2
(45) Date of Patent: *Nov. 4, 2014

(54) LITHOGRAPHIC PRINTING PLATE COMPRISING A POROUS NON-ANODIC LAYER

(75) Inventors: Dina Katsir, Beer Sheva (IL); Zvi Finkelstein, Asseret (IL); Yuri Zarnitsky, Ashdod (IL)

(73) Assignee: Acktar Ltd., Kiryat Gat (IL)

( * ) Notice: Subject to any disclaimer, the term of this patent is extended or adjusted under 35 U.S.C. 154(b) by 0 days.

This patent is subject to a terminal disclaimer.

(21) Appl. No.: 11/242,292

(22) Filed: Oct. 3, 2005

(65) Prior Publication Data
US 2006/0086273 A1    Apr. 27, 2006

(30) Foreign Application Priority Data
Oct. 1, 2004 (GB) .................................. 0421810.3

(51) Int. Cl.
| | |
|---|---|
| B41N 1/00 | (2006.01) |
| B41N 3/00 | (2006.01) |
| G03C 1/00 | (2006.01) |
| G03F 7/00 | (2006.01) |
| G03F 7/11 | (2006.01) |
| B41N 1/08 | (2006.01) |

(52) U.S. Cl.
CPC ... B41N 1/08 (2013.01); G03F 7/11 (2013.01)
USPC .................. 430/278.1; 430/270.1; 430/275.1; 430/302; 101/453; 101/454; 101/456; 101/458; 101/459

(58) Field of Classification Search
USPC .......... 430/270.1, 275.1, 278.1, 271.1, 273.1; 428/540–700
See application file for complete search history.

(56) References Cited

U.S. PATENT DOCUMENTS

| 3,660,252 A | 5/1972 | Giori |
|---|---|---|
| 3,839,037 A | 10/1974 | Fromson |

(Continued)

FOREIGN PATENT DOCUMENTS

| BE | 790 766 | 4/1973 |
|---|---|---|
| EP | 1 148 386 | 10/2001 |

(Continued)

OTHER PUBLICATIONS

Extended European Search Report of EP Application No. 05077224.3 dated Apr. 29, 2008.

*Primary Examiner* — Chanceity Robinson
(74) *Attorney, Agent, or Firm* — Pearl Cohen Zedek Latzer Baratz LLP

(57) ABSTRACT

A printing plate comprises a substantially planar substrate, a porous non-anodic ungrained coating, having a thickness within the range of about 0.1 to about 30 microns and comprising at least one of metals, metal oxides and admixtures thereof, and an image recording layer, provided that where the porous coating consists essentially of oxide(s) only, it comprises at least one oxide of copper, magnesium, cadmium, aluminum, zirconium, hafnium, thorium, chromium, tungsten, molybdenum and (or) cobalt, and further provided that where the porous coating consists essentially of alumina only, it comprises specified pores. The invention also relates to an article of manufacture having a nanometric porous surface layer comprising at least one of metals, metal oxides and mixtures thereof, which comprises pores in the surface layer having a width in a range 0-100 nm, and wherein a major number of pores in this range have a width in a band of about 1 to about 30 nm.

25 Claims, 6 Drawing Sheets

(56) References Cited

U.S. PATENT DOCUMENTS

| | | | |
|---|---|---|---|
| 4,430,366 A * | 2/1984 | Crawford et al. | 427/162 |
| 4,522,912 A | 6/1985 | Sharkozy et al. | |
| 4,526,839 A | 7/1985 | Herman et al. | |
| 4,585,529 A | 4/1986 | Kanda et al. | |
| 4,596,189 A | 6/1986 | Halpern et al. | |
| 4,996,131 A | 2/1991 | Nouel | |
| 5,082,537 A | 1/1992 | Stroszynski et al. | |
| 5,314,607 A | 5/1994 | Kaneko et al. | |
| 5,462,614 A | 10/1995 | Sawada et al. | |
| 5,871,883 A * | 2/1999 | Hirano et al. | 430/272.1 |
| 5,881,645 A | 3/1999 | Lenniy et al. | |
| 6,207,349 B1 | 3/2001 | Lewis | |
| 6,234,166 B1 | 5/2001 | Katsir et al. | |
| 6,242,156 B1 * | 6/2001 | Teng | 430/270.1 |
| 6,287,673 B1 | 9/2001 | Katsir et al. | |
| 6,694,880 B1 | 2/2004 | Mori et al. | |
| 6,759,175 B2 * | 7/2004 | Daems et al. | 430/199 |
| 6,764,587 B2 | 7/2004 | Sawada et al. | |
| 6,764,712 B2 | 7/2004 | Katsir et al. | |
| 6,865,071 B2 | 3/2005 | Katsir et al. | |
| 6,933,041 B2 | 8/2005 | Katsir et al. | |
| 2002/0001776 A1 * | 1/2002 | Mori et al. | 430/302 |
| 2003/0194648 A1 | 10/2003 | Murota et al. | |
| 2003/0215750 A1 * | 11/2003 | Inno | 430/302 |
| 2004/0053167 A1 | 3/2004 | Hotta | |
| 2004/0079252 A1 | 4/2004 | Sawada | |
| 2004/0137365 A1 | 7/2004 | Kawauchi | |
| 2004/0154488 A1 * | 8/2004 | Tomita et al. | 101/458 |
| 2004/0157150 A1 * | 8/2004 | Mori | 430/270.1 |
| 2004/0168929 A1 | 9/2004 | Katsir et al. | |
| 2006/0046185 A1 * | 3/2006 | Goto | 430/270.1 |

FOREIGN PATENT DOCUMENTS

| | | |
|---|---|---|
| EP | 1 247 644 | 10/2002 |
| EP | 1 279 520 | 1/2003 |
| EP | 1 300 257 | 4/2003 |
| EP | 1464513 A1 | 6/2004 |
| WO | WO0176768 A1 | 10/2001 |

* cited by examiner

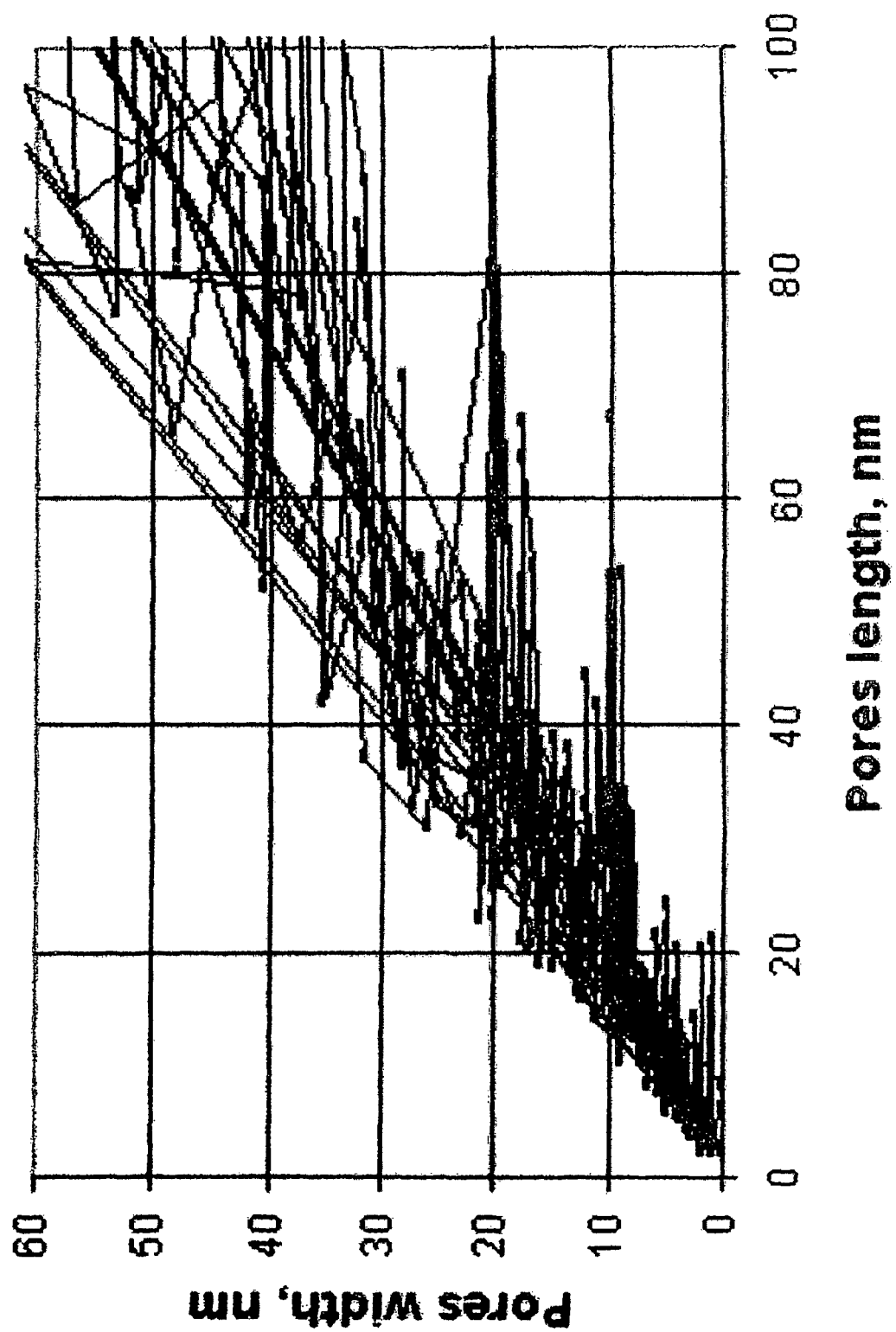

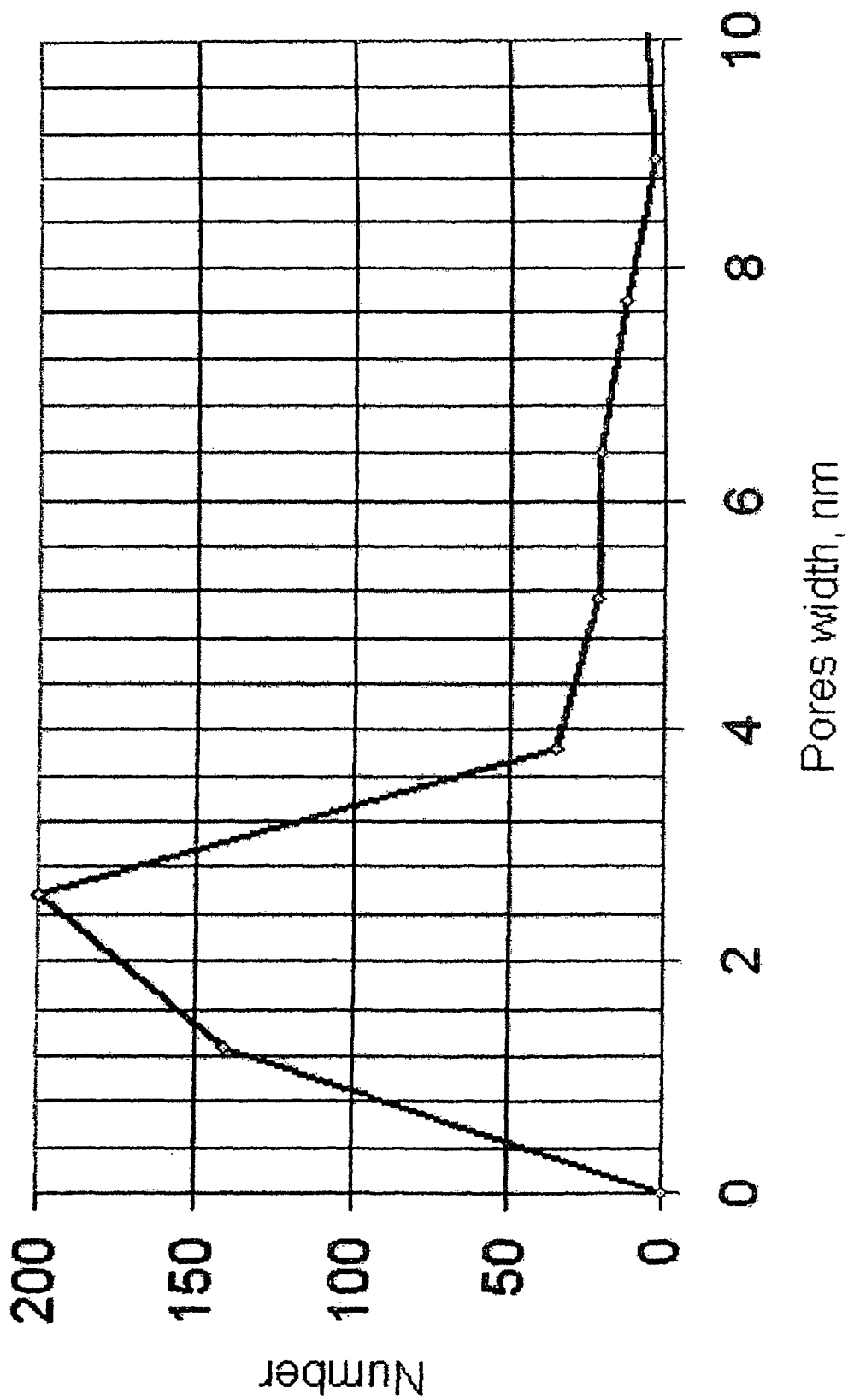
Fig. 3A PWD of alumina coating

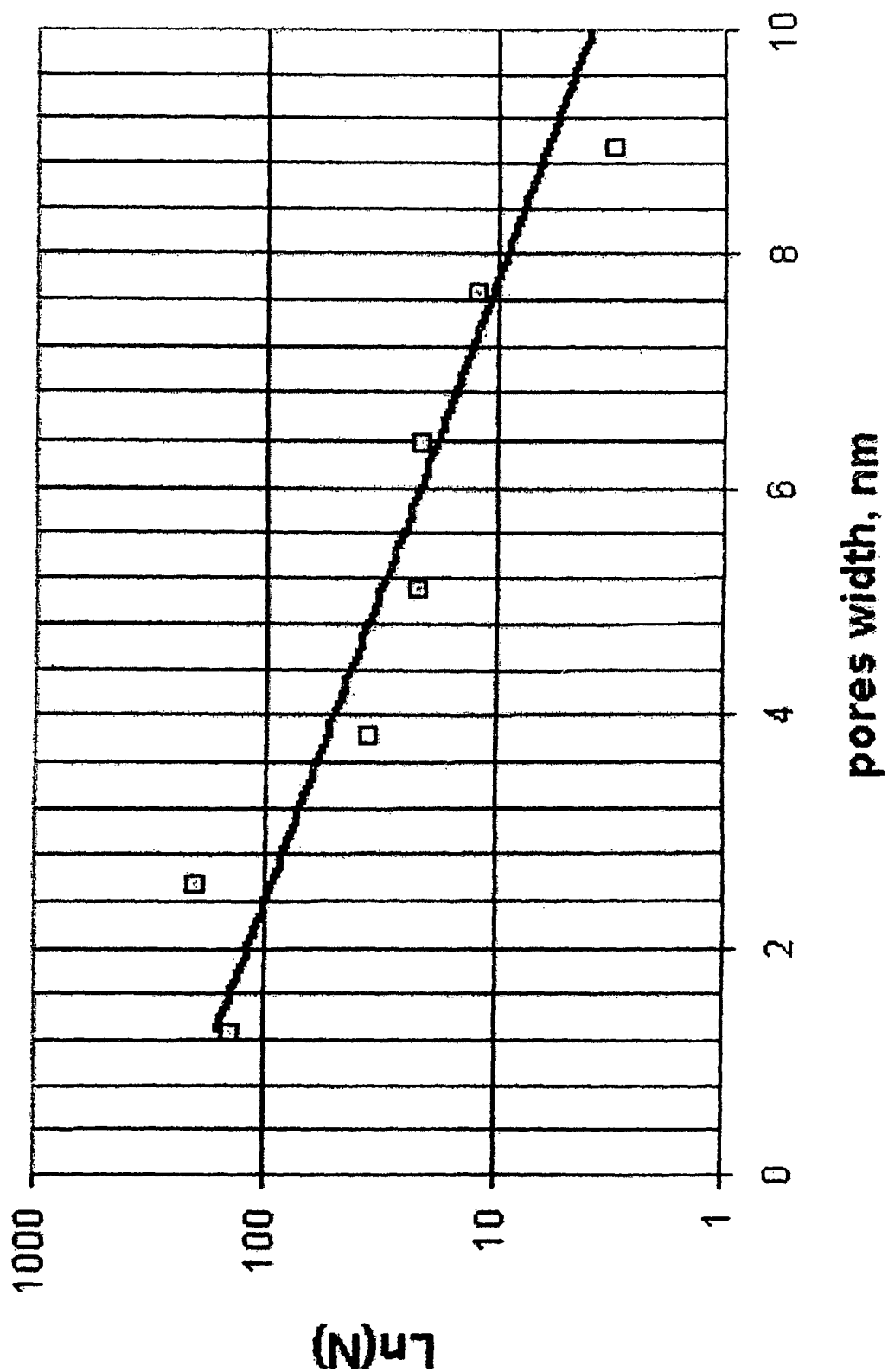
Fig. 3B PWD of alumina coating

WATER DROP TEST RESULTS
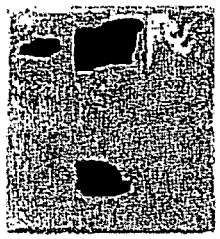 №1
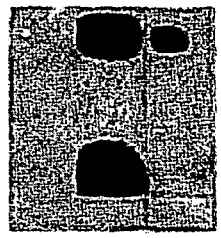 №2
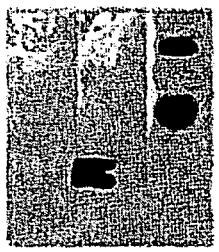 №3
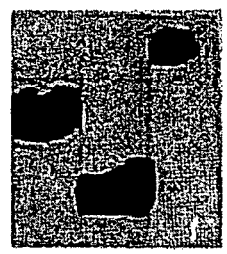 №4
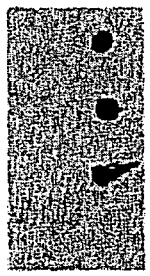 №5
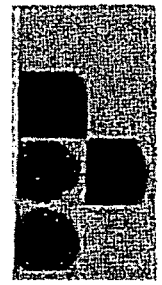 №6
Fig. 5 Examples of aluminum substrates, coated by vacuum deposition in comparison with conventional etched aluminum supports
1. Non-treated sample 5; 2. treated sample 5; 3. non-treated sample 7; 4. treated sample 7; 5. non-treated control sample; 6. treated control sample. Grid size is equal to 1 cm.

LITHOGRAPHIC PRINTING PLATE COMPRISING A POROUS NON-ANODIC LAYER

BACKGROUND OF THE INVENTION

Photosensitized laminates find application in the printing and electronic circuit arts, and particularly for lithographic printing plates. Simply stated, the laminates (e.g. printing plates) comprise a substrate (usually metallic) and a photosensitive layer. Exemplary metallic substrates are aluminum, aluminum alloys, chromium and stainless steel. The composition of the photosensitive layer is such that when it is exposed to light, either (in a first type, e.g. bichromated colloid) the exposed parts become solvent (e.g. water) insoluble and remain when the unexposed parts are washed away by the solvent, or in the alternative, the unexposed parts are solvent insoluble and remain on the substrate, while the exposed parts have become solvent soluble and may be washed away. Depending on the nature of the composition and the image, i.e. whether the latter is positive or negative, either positive or negative images are formed on the substrate.

The images described above are generally receptive to inks, which are oil- or grease-based. Ink-receptivity may be improved, e.g., by application of lacquers. Moreover, in order to obtain clear prints from the images on the laminate surfaces, the non-image areas must be wettable by water, i.e. hydrophilic. Conventionally, a metal substrate is made wettable by anodic oxidation, see e.g. the anodization apparatus and process described in U.S. Pat. No. 5,314,607 (Kaneko et al.). The oxide layer thus formed on metal substrates giving rise to tenacious oxides (e.g. on aluminum or stainless steel) is intrinsically both stable and hydrophilic, whereas on zinc or iron, the oxide is not stable. It is well-known to stabilize zinc oxide surfaces by treatment with solutions of ammonium bichromate/sulfuric acid or ammonium alum/nitric acid. While an anodized (i.e. oxidized) surface of aluminum, if continuous and unbroken could be used without further treatment, once this develops faults it becomes unusable. In order to address this potential problem, anodized aluminum may be treated with e.g., a solution of ammonium bichromate/hydrofluoric acid. Alternatively, metal substrates may be made wettable by etching. It is known that aluminum, chromium and stainless steel may be etched satisfactorily with a solution of gum arabic/phosphoric acid, which is however too corrosive for zinc; in the latter case a solution of carboxymethyl cellulose sodium salt (CMC)/phosphoric acid/magnesium nitrate has been found to be suitable, but in this formulation a combination of tannic acid and potassium chrome alum (e.g.) may be used instead of magnesium nitrate.

The treatment described in the preceding paragraph results in the interposition of a hydrophilic layer between the metallic substrate and the photosensitive layer. The term "hydrophilic layer" in this context is intended to include both a single hydrophilic layer, and two or more adjacent hydrophilic sub-layers.

U.S. Pat. No. 6,207,349 (Lewis) discloses a procedure for easing interfacial transition between organic (polymeric) and inorganic layers in a lithographic plate by incorporating an inorganic component in a softened curable polymer deposited on a substrate, curing and depositing an inorganic layer thereover. The deposit of curable polymer may comprise a plurality pf sub-layers, each containing a different or graded proportion of the inorganic component. The inorganic layer may function as the hydrophilic layer in the lithographic plate.

In order to obtain relatively fine grained images and prints, it has become conventional to form a fine grain or crystal structure in the surface of the metallic substrate by abrasive, chemical and/or electrolytic treatment, referred to hereinafter as "graining", while a surface not subjected to such treatment will be referred to herein as "ungrained". Paradoxically, an alternative term for the same process is "roughening". This procedure may be effected by wet or dry abrasion, using e.g., steel, alumina, sand, quartz or silicon carbide particles. U.S. Pat. No. 5,082,537 (Stroszynski et al) describes a combination of mechanical and electrochemical roughening, while e.g., U.S. Pat. No. 5,462,614 (Sawada et el.) and U.S. Pat. No. 4,585,529 (Kanda et al.), and U.S. patent application Ser. No. 10/655,369 published as 2004/0079252 A1 (Sawada et el.) mention mechanical, chemical and/or electrochemical surface graining.

U.S. Pat. No. 6,764,587 (Sawada, et al.) describes a process for producing an aluminum support for a planographic printing plate, by electrochemically surface-roughening the aluminum plate in an aqueous acidic solution; using an alternating current under prescribed conditions, A variation of the above is the bimetal plate, usually copper electroplated on an aluminum or stainless steel substrate. The copper is ink-receptive and water-repellent, while the substrate is water-receptive and ink-repellent, i.e., hydrophilic. The copper surface is coated with a photosensitive layer and exposed to an object e.g. a negative. The unexposed parts of the photosensitive layer are removed, developing a coated image. Now the remaining copper (not part of the image composite) is removed by an etching liquid such as ferric chloride solution, which does not attack the underlying substrate. Any residue is cleaned with a mild abrasive which does not affect the developed image. Finally, the developed formerly photosensitive coating is removed leaving an ink-receptive copper image on the substrate. Similarly, U.S. Pat. No. 4,996,131 (Nouel) describes an offset printing plate comprising a hard, hydrophilic steel and deposited thereon a layer of dull, porous, ink-rejecting chromium (e.g. by contacting the steel base with a chromium-containing electrolytic solution and subsequently passing a current) having a thickness≤1 micron, of which a selected area may be removed subsequently, the chromium supporting a layer of photosensitive material.

U.S. Pat. No. 4,596,189 (Halpern et al.) describes a lithographic printing plate comprising a porous metal coating on a substrate and a light sensitive coating on the porous metal coating. The porous metal coating is produced by thermal spraying, and is typically 75 microns thick. After spraying, the coating is rolled to reduce the coating thickness to about half, while simultaneously closing the pores. The pores are reopened by removing part of the surface, e.g. by graining.

U.S. Pat. No. 3,839,037 (Fromson) describes a light-sensitive composite useful in the printing and electronic circuit arts, comprising a substrate and a light-sensitive coating thereon, and an ultra-thin light-transmitting and solvent-permeable protective coating over the light-sensitive coating, the protective coating being preferably a vapor-deposited metal coating.

U.S. Pat. No. 6,694,880 (Mori et al.) describes a printing plate provided with a material which is hydrophilic at a first temperature and hydrophobic at a relatively lower second temperature. The printing plate may include one or more of a defined group of simple or complex metal oxides.

U.S. patent application Ser. No. 10/653,928 published as 2004/0053167 A1 (Hotta) describes a method for the production of a support for a lithographic printing plate precursor that comprises providing on a grained aluminum support having an anodic oxide film formed thereon, a layer of inorganic compound particles having a major axis larger than a pore diameter of the anodic oxide film, and treating with a solution capable of dissolving the inorganic compound particles, which are thus fused together to form a layer of the inorganic compound. In a specified support, the ratio of pore diameter of the layer of inorganic compound to pore diameter of the anodic oxide film is not less than 1.5 and the ratio of F or Si of the layer of inorganic compound to the anodic oxide film is not less than 2.

U.S. patent application Ser. No. 10/743,412 published as 2004/0137365 A1 (Kawauchi, et al.) describes an infrared-sensitive lithographic printing plate capable of direct plate-making based on digital data from a computer or the like, comprising a support and a heat-sensitive layer, the latter comprising (A) a copolymer having a specific carboxylic monomer unit, (B) an alkali-soluble high MW compound having a sulfonamide group, and (C) a light-heat conversion material.

U.S. patent application Ser. No. 10/404,120 published as 2003/0194648 A1 (Murota et al.) describes lithographic printing plates comprising an aluminum substrate which has, on the surface, grained structures comprising medium waved structure whose average pore size ranges from 0.5. to 5 μm and small waved structure whose average pore size ranges from 0.01 to 0.2 μm (and optionally a large waved structure) which are superimposed.

The following patents and patent applications which have common ownership and/or common inventorship with the present invention, describe products and techniques which have relevance to the present invention.

U.S. Pat. No. 6,234,166 (Katsir et al.) describes a solar absorber-reflector, in which certain elements may be vacuum deposited aluminum or aluminum black.

U.S. Pat. No. 6,287,673 (Katsir et al.) describes and claims an anodized electrode, comprising an electrically conductive substrate. and a dielectric coating, on the surface of the substrate, having a bimodal morphology, in that the coating includes both a non-electrolytically formed valve metal oxide layer and an electrolytically formed layer, wherein the non-electrolytically formed layer is homogeneous and the electrolytically formed layer is increasingly porous towards its outer surface.

U.S. Pat. No. 6,764,712 (Katsir et al.) describes and claims a method for increasing the surface area of a substrate, comprising the steps of: (a) placing the substrate in an inert atmosphere, at $10^{-3}$ Torr to $10^{-2}$ Torr pressure, into which oxygen has been introduced at a pressure of from one to two orders of magnitude less than that just mentioned, and (b) evaporating at least one metal, selected from valve metals only, onto a heated substrate under said oxygen-containing inert atmosphere, whereby the product comprises a mixture of fractal surface structure including at least one valve metal and at least one valve metal oxide deposited on the substrate.

U.S. Pat. No. 6,933,041 (Katsir et al.) describes and claims an article of manufacture having a vacuum deposited fractal surficial structure, which includes both valve metal and an oxide thereof, the valve metal being selected from aluminum, titanium, tantalum, niobium, zirconium, silicon, thorium, cadmium and tungsten, as well as an electrode comprising:

(a) an electrically conductive substrate; and (b) a discontinuous vacuum deposited layer of an oxide of a first valve metal (selected from aluminum, titanium, tantalum, niobium, zirconium, thorium, cadmium and tungsten), on a surface of the substrate.

WO 0176768 (Acktar Ltd., Katsir et al.). describes a method and apparatus for temperature controlled vapor deposition on a substrate.

U.S. Pat. No. 6,865,071 (Katsir et al.) describes and claims integrated electrolytic capacitors and a method for making them.

In U.S. patent application Ser. No. 10/730,537 published as 2004-0168929 A1 (Katsir et al.), there is described and claimed an anodized electrode comprising: a substrate; a vacuum deposited porous coating thereon, comprising at least one substance selected from valve metals, valve metal oxides and their mixtures; and at least one electrolytically produced anodized layer selected from valve metal oxides and mixtures thereof; wherein in the porous coating, prior to electrolytic anodization, the effective surface area has been increased, e.g. by increasing the total pore volume of the porous coating, and/or by increasing the average pore width in the porous coating at its surface.

The entire contents of the above-mentioned patents and patent applications are incorporated by reference herein.

DEFINITIONS

The "printing plate" with which the present invention is concerned may be single-sided or double-sided, but otherwise has the ordinary meaning of this term to a person of the art. Thus, by way of example, it includes lithographic and offset printing plates.

A "metal" or "metals" include(s) single metallic elements and admixtures and alloys thereof, unless the context specifically indicates the contrary. A "valve metal" means one (or more than one depending on the context) of the following: magnesium, thorium, cadmium, tungsten, tin, iron, silver, silicon, tantalum, titanium, aluminum, zirconium and niobium.

An "anodic" layer means a layer made by anodic oxidation (electrolytic or non-electrolytic) of the surface of an existing metal layer. A "non-anodic" layer is one made other than by anodic oxidation of an existing metal layer, as e.g., by vacuum deposition.

An "ungrained" metallic layer, coating or substrate means one which has not been subjected to graining, i.e. it has not been subjected to abrasive, chemical and/or electrolytic treatment, so as to form a fine grain or crystal structure in the surface of the metallic layer, coating or substrate.

The term "vacuum deposition" includes all vacuum deposition techniques such as e.g., thermal resistive evaporation, electron beam evaporation, electric arc deposition, laser deposition and sputtering.

Pore dimensions (width and length) mentioned herein are those obtained using a scanning electron microscope (SEM) unless stated otherwise, and refer to such dimensions at the outer surface of the relevant layer or coating.

SUMMARY OF THE INVENTION

The present invention provides a printing plate which comprises in the stated sequence: (a) a substantially planar substrate, (b) a porous vacuum deposited ungrained coating, having a thickness within the range of about 0.1 to about 30 microns and comprising at least one member of the group consisting of metals, metal oxides and admixtures thereof, and an image recording layer, provided that where said porous coating consists essentially of oxide(s) only, it comprises (or consists essentially of) at least one oxide of a metal selected from the group consisting of copper, magnesium, cadmium, aluminum, zirconium, hafnium, thorium, chromium, tungsten, molybdenum and cobalt, and further provided that where said porous coating consists essentially of alumina only, it comprises pores having widths within the range of from 1 to 30 nm.

In another aspect, the present invention provides a printing plate which comprises in the stated sequence: (a) a substantially planar substrate; (b) a porous vacuum deposited ungrained coating, having a thickness within the range of about 0.1 to about 30 microns and comprising at least one member of the group consisting of metals, metal oxides and admixtures thereof, and (c) an image recording layer, provided that where said porous coating consists essentially of oxide(s) only, it comprises at least one oxide of a metal selected from the group consisting of copper, magnesium, cadmium, aluminum, zirconium, hafnium, thorium, chromium, tungsten, molybdenum and cobalt, and further provided that where said porous coating consists essentially of alumina only, it comprises pores having widths within the range of from 1 to 30 nm.

In yet another aspect, the invention provides an article of manufacture having a nanometric porous surface layer and comprising: (a) a substantially planar substrate, and (b) a porous vacuum deposited ungrained coating on said substrate, having a thickness within the range of 0.1 to 30 microns and comprising at least one member of the group consisting of metals, metal oxides and admixtures thereof, which comprises pores in the surface layer thereof having a pore width in a range up to 100 nm, and wherein a major number of pores in said range have a width in a band of 1 to 30 nm, provided that where said porous coating consists essentially of oxide(s) only, it comprises at least one oxide of a metal selected from the group consisting of copper, magnesium, cadmium, aluminum, zirconium, hafnium, thorium, chromium, tungsten, molybdenum and cobalt, and further provided that where said porous coating consists essentially of alumina only, it comprises pores having widths within the range of from 1 to 30 nm.

The porous surface layer is preferably further characterized by at least one of the following features: (a) a major part of the said 1 to 30 nm width pores have a pore length which lies within the range of from 1 to 2 times the width of said pores; (b) a concentration of pores within a band width of 1-8 nm pore width, with a peak at about 3.5 nm; (c) in a broad band width from 8 nm to 10,000 nm, the most numerous pores are concentrated in a range of 10 to 30 nm, and the next most numerous pores are concentrated in a range of 200 to 5000 nm; (d) it comprises a fractal configuration; (e) said metals are valve metals and said metal oxides are valve metal oxides.

In still another aspect, the invention provides a printing plate which comprises in the stated sequence: (a) a substantially planar substrate; (b) a porous vacuum deposited coating, having a thickness within the range of 0.1 to 30 microns, and which comprises at least one member of the group consisting of metals, metal oxides and admixtures thereof; and (c) an optional hydrophilic layer, provided that where said porous coating consists essentially of oxide(s) only, it comprises at least one oxide of a metal selected from the group consisting of copper, magnesium, cadmium, aluminum, zirconium, hafnium, thorium, chromium, tungsten, molybdenum and cobalt, and further provided that where said porous coating consists essentially of alumina only, it comprises pores having widths within the range of from 1 to 30 nm.

BRIEF DESCRIPTION OF THE DRAWINGS

FIG. 2 shows a plot of width against length, for the ungrained coating on a substrate, in an embodiment of the printing plate of the present invention.

FIG. 3A shows pore width distribution in a range below about 10 nm for the ungrained coating on a substrate, the vertical axis depicting the number of pores on a standard numerical scale, in an embodiment of the printing plate of the present invention.

FIG. 3B shows the same data as FIG. 3A, except that the vertical axis depicts the number of pores on a logarithmic scale.

FIG. 5 shows results of a drop test carried out on an embodiment of the printing plate of the present invention.

DETAILED DESCRIPTION OF THE INVENTION

Figure 1:
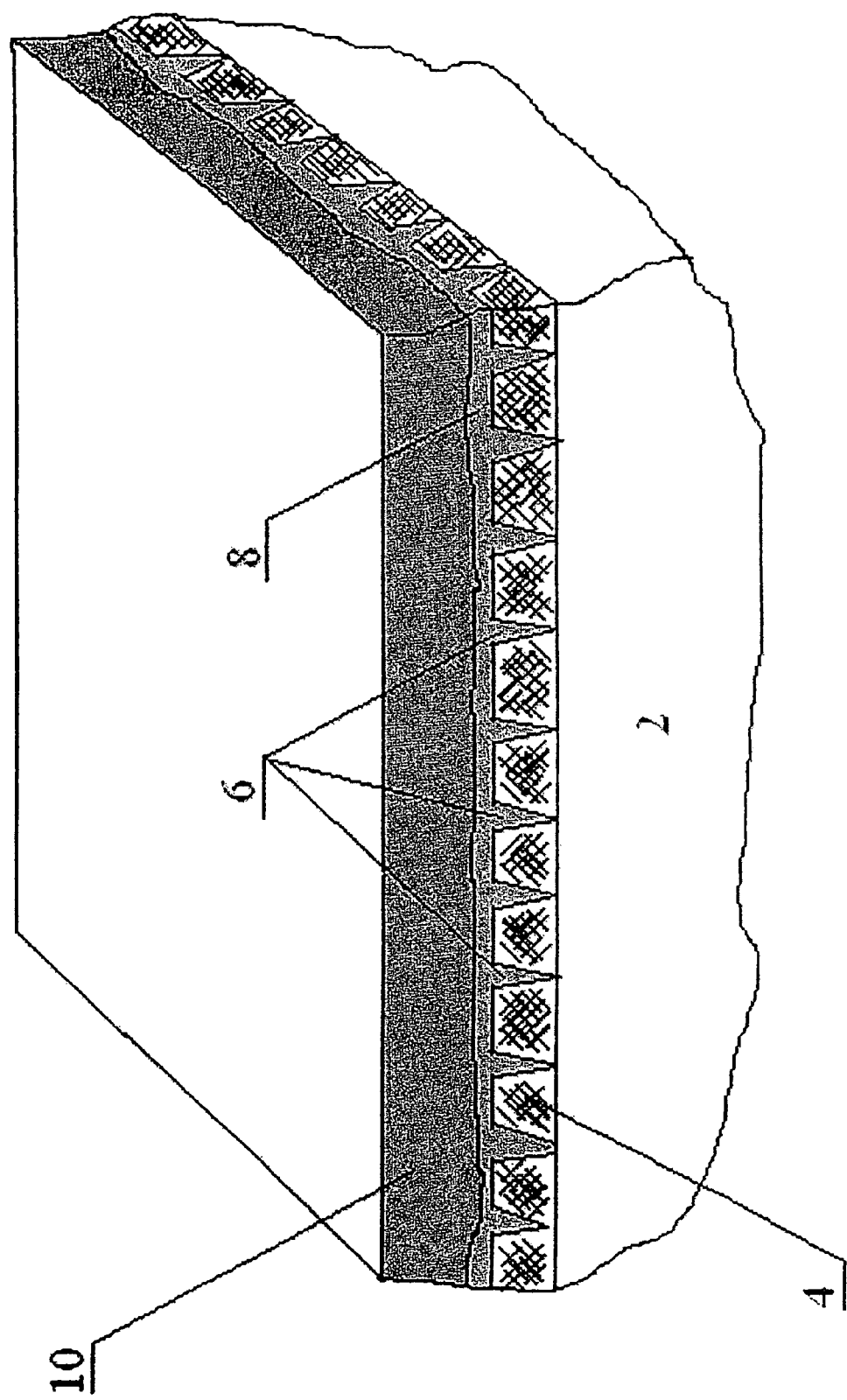
FIG. 1 shows schematically, an embodiment of the printing plate of the present invention.

It will be apparent that in order to obtain the initial porous non-anodic ungrained coating on the substrate, which characterizes the printing plates of the present invention, there will be applied to the substrate from external sources a coating comprising at least one member of the group consisting of metals, metal oxides and admixtures thereof. Such a coating is thus distinct from the surface of a substrate which has been subjected to physical or surface treatment, but to which no coating has been applied.

The printing plate of the invention is preferably further characterized by at least one of the following features: (i) coating (b) comprises at least one member of the group consisting of (α) and (β), namely: (α) valve metals and chromium, and (β) admixtures of at least one metal selected from valve metal and chromium, with at least one oxide selected from oxides of valve metal and chromium; (ii) layer (c) is selected from hydrophilic metal layers and hydrophilic metal oxide layers; (iii) the substrate is selected from aluminum, aluminum alloy, chromium and stainless steel substrates.

In particular embodiments of the invention, coating (b) comprises an admixture of at least one valve metal selected with at least one valve metal oxide, particularly such a layer having a fractal surface structure; and/or layer (c) is selected from hydrophilic metallic copper and hydrophilic valve metal oxide layers, more preferably being selected from anodic or non-anodic valve metal oxide layers; the substrate is selected from supported aluminum and aluminum alloy foils, e.g. supported by a relatively more rigid metal or polymeric base; the plate comprises additionally an organic undercoat layer located between said coating and said image recording layer; and/or the image recording layer includes a polymeric matrix.

In a further particular embodiment: (I) in coating (b), of the printing plate of the invention, said metals and metal oxides are selected from valve metals and chromium and their oxides, provided that coating (b) does not consist of 100% metal, and that at least one of layers (b) and (c), as defined herein, has an at least 65%, e.g., 70-90% absorbance to infrared radiation; and(or) (II) coating (b) is a vacuum deposited layer.

In yet another embodiment, in the printing plate according to the invention, the substrate is selected from aluminum and aluminum alloy foils adhered to a relatively more rigid disposable or re-usable base support selected from metallic and polymeric supports.

Layer (c) may be, for example, an anodic metal oxide layer or a vacuum deposited layer. In a particular embodiment, both layers (b) and (c) are vacuum deposited; it is believed that this embodiment will be advantageous structurally (good adherence) and also economically, insofar as vacuum deposition of both layers can be effected in the same apparatus.

The usual values of IR absorbance of our samples were near 70-90% as measured integrally for wavelengths of range from 5 to 30 microns by a D&S Emissiometer Model AE.

FIG. 1 illustrates schematically, an embodiment of the inventive printing plates, in which a substantially planar substrate 2 (e.g. of aluminum foil) has been coated e.g. with a porous layer 4 (of which pores 6 are shown in the figure) comprising e.g. an anodizable metal such as aluminum, but which may include also e.g. aluminum oxide, layer 4 having been applied e.g. by vacuum deposition. Layer 8 of e.g. aluminum oxide has been applied e.g. by anodization and has been superimposed on layer 4. Finally, in this embodiment, an image recording layer 10 has been applied to layer 6 by conventional coating techniques, including initial deposition of an intermediate organic polymeric layer (not shown) on layer 8, for improved adhesion of image recording layer 10.

The dimensions of the uniformly distributed pores shown in FIGS. 2, 3A, 3B and 4, were determined by use of a scanning electron microscope (SEM) with a magnification level up to 160000 (for results, see below). Additionally, no defects in the surface oxide coating, such as spot-like soiling and streaking, which could adversely affect subsequent quality of printing, were observed.

It is believed that the presence of relatively large pore widths (200-5000 nm) and thus large pore volume of these pores will contribute positively to the ability of the present printing plates to absorb liquids. Nevertheless, should it be desired to remove (or reduce the number of) these large pores, so that the surface has a more homogeneous nanometric pore structure, it is presently contemplated that the large pores would be filled first in an anodization reaction, thus leaving the relatively smaller pores, mainly below 30 nm. It may be noted that pore width distribution data have been confirmed by an electrochemical method, based on capacitance measurements.

The present invention will now be illustrated by the following non-limiting examples.

EXAMPLE 1

A set of degreased aluminum substrate foils (7 pieces) of 63.5 microns thickness and 100 cm$^2$ area was prepared for vacuum deposition by conventional washing with a hot aqueous solution of organic carboxylic acid(s), sodium salt(s), followed by cleaning, using 6% aqueous alkaline NaOH at room temperature, and then washing (spraying) with high-purity de-ionized water, and drying. These foils were used to deposit in vacuum on one side, a two-layer coating. The first layer of thickness 0.7-1.3 microns was thermally deposited from pure aluminum vapors in an inert atmosphere of argon, having a residual gas pressure near to, or less than, 0.3 mTorr with the metal condensation rate near 300 Angstrom per second to provide for the second layer as a strong and reliably adherent oxide coating. The second layer of 5-20 microns thickness was deposited, also from pure aluminum vapors, but in a reactive atmosphere of pure oxygen in a vacuum chamber. The rate of alumina condensation was in the range 220-340 Angstrom/sec, the oxygen pressure being in the range 1.8-2.1 mTorr. The substrate temperature during vacuum deposition was in the range 150-200° C. The thus-produced coating was a transparent layer, consisting of high porosity aluminum oxide with an average specific weight 1.3 g/cm$^3$. The porosity of the oxide coating was measured by the weight method of soaked silicon-based oil TKO-19+. This value was determined to be 60±5%. The consequently averaged specific weight of the bulk coating was equal to 3.2 g/cm$^3$. This estimation of oxide density corresponds obviously to known experimental data for $Al_2O_3$ bulk density.

FIG. 3A is a graph of pore width distribution (PWD) results, for a range below about 10 nm, and shows a concentration of pores within a band of about 1-8 nm pore width, with a peak at about 3.5 nm. FIG. 3B depicts the same data as FIG. 3A, except that the vertical scale is logarithmic. The linear relationship in FIG. 3B is indicative of the fractal nature of the deposited oxide layer.

This substrate was ready to be completely covered by an organic undercoat layer. A silane compound such as ethylenetetramethoxysilane or etylenetetraethoxysilane, dissolved in a solvent such as a methanol or ethanol in a proportion of 1 to 20 wt. % and hydrolyzed in the presence of an acid catalyst, such as nitric acid, phosphoric acid or sulfonic acid, preferably 5 to 100 mg/m$^2$, is used prior to deposit of a light sensitive layer, containing for example o-naphthoquinone-diazidosulfonate. The latter is preferably prepared by mixing it with alkali-soluble resin, thermosetting resin or ultraviolet curing resin; the porosity of the oxide coating provides also good adhesion of the photo-resist compound layer. This coating is intended to form an image area on the surface of the substrate after exposure to actinic light and development of the printing plate. The entire surface of the plate is firstly soaked with water, the ink-receptive image area repelling water. However, the uncoated area of substrate is available to hold water inside the pores of the oxide coating. Therefore, these areas of photo-resist surface are not ink-receptive when printer's oleophilic ink is applied to the plate surface.

These samples were examined for mechanical strength, mechanical stability and quality of adhesion with respect to multiple substrate bending. These parameters were compared with those for conventional aluminum supports of the same thickness, subjected to electrochemical surface etching. It was clearly established that the oxide-coated aluminum foils had excellent hardness, tensile and breaking strength, which exceeded those for an etched aluminum surface, almost certainly due to the absence of internal pores and surface irregularities. Adhesion stability of the oxide coating with respect to impact and multiple plate bending was found to depend on the coating thickness; it was observed that an oxide coating thickness of about 15 microns (superimposed on a vacuum deposited pure aluminum sub-layer as described above) had strong adhesion. Further, the hydrophilic properties of the surface were tested before and after conventional hydrophilic treatment. Exemplary chemical compounds which may by used to improve such hydrophilic properties are as follows:

1) Alkali metal silicates,
2) Potassium fluorozirconate,
3) Organic Ti-containing compounds,
4) Ferro- and ferri- cyanides,
5) Polyacrylic acid,
6) Carboxymethylcellulose,
7) Gallic acid,
8) Phosphotungstates,
9) Polyvinylphosphonic acid,
10) Gum arabic.

The above-mentioned treatment was carried out by immersion in (e.g.) 2.5% sodium silicate solution at the temperature of 70° C. for 20 seconds. An excellent degree of surface wetting and saturation of oxide coating before, and especially after such treatment was observed, by means of the water-drop test, which was carried out on dry samples of substrate. It was thus observed, that water drops spread quickly and in an isotropic manner, over the surface, up to a small edge angle, following water soaking (absorbing) by the oxide coating. The area of the produced damp spot on the plate surface, near to 1 cm$^2$, corresponded to 50% water absorption before the treatment, and almost the entire water drop absorption after it. Examples of damp spots on these surfaces are represented on FIG. 5 as compared with conventional one. Besides good mechanical and hydrophilic properties, these vacuum deposited surfaces are expected to be resistant to soiling after printing thousands of copies, by comparison with a conventional printing plate surface.

EXAMPLE 2

Deposition of Fractal-Like $Al/Al_2O_3$ Surfaces

Aluminum was evaporated, by thermal resistive evaporation, onto clean aluminum foil substrates held at a temperature of 300° C. in an anhydrous atmosphere of nitrogen at a pressure of between 0.002 Torr and 0.005 torr and oxygen at pressures between $2\times10^{-4}$ Torr and $5\times10^{-4}$ Torr. The deposition rate was about 300 Å/sec.

Photomicrographs show that the thus-prepared surface has a fractal-like aluminum surface, having a cauliflower-like morphology, in which the "cauliflower heads" are about 2 microns across, and the "florets" are about 0.2 microns across, so that the surface is self-similar at least on a distance scale from 0.2 microns to 2 microns. This is confirmed by the visual appearance of the surface. Unlike similar surfaces with greater than 50% aluminum oxide content, which are black and shiny (specularly reflective), this surface is black matte (diffusely reflective), showing that this surface has a fractal-like structure on the length scale of the wavelengths of visible light.

FIG. 2 shows a plot of pore width versus pore length, in the porous vacuum deposited layer. It is noted that a major number of pores, at least in the range shown up to about 100 nm, have a surface width in a band of about 1 to about 30 nm, and of these 1-30 nm pores, a major part have a pore length which lies within the range of from 1 to 2 times the pore width.

The following table is an EDS elemental analysis of one of the surfaces:

| | |
|---|---|
| N | 1.18% |
| O | 30.43% |
| Al | 66.38% |
| P | 1.79% |
| Ar | 0.22% |

It follows from stoichiometry that 30.3% of the aluminum was in the form of $Al_2O_3$ and 69.7% was in the form of aluminum metal.

The thus-treated foil may be utilized in a printing plate as set forth in Example 1, above.

Enlargement of Pores (Examples 3-5)

Figure 4:
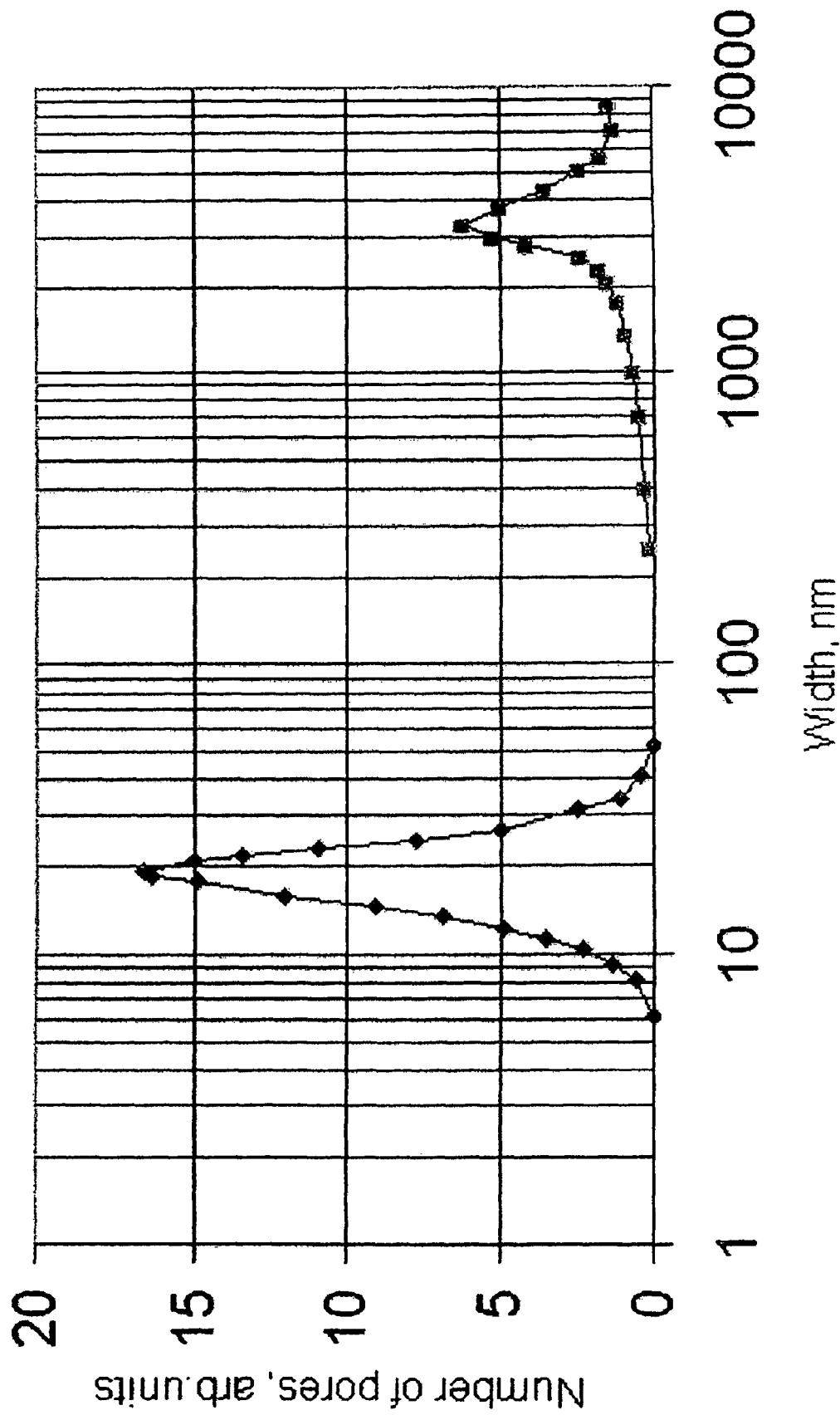
FIG. 4 shows pore width distribution in a range from about 8 nm to about 10,000 nm, for the ungrained coating on a substrate, in an embodiment of the printing plate of the present invention.

FIG. 4 is a graph of pore width distribution, in the surface where the pores have been enlarged in accordance with these examples, in a range from about 8 nm to about 10,000 nm, and shows that the most numerous pores are concentrated in a range of about 10 to about 30 nm with a peak at about 20 nm, and the next most numerous pores are concentrated in a range of about 200 to about 5000 nm, with a peak at about 3000 nm.

EXAMPLE 3

An anodized foil is manufactured by the following stepwise procedure:

1. A high-purity aluminum foil substrate is subjected to reactive deposition of $Al/Al_2O_3$ in an inert gas atmosphere having a pressure of between about $10^{-3}$ Torr. and about $10^{-2}$ Torr., containing also a partial pressure of oxygen, as described in U.S. Pat. No. 6,287,673.
2. The product of step 1 is anodized by DC current at an initial current density of about 2 A/dm² in an 0.83M aqueous solution of ammonium adipate, at a temperature of about 85° C. Anodization is continued up to 10 minutes past current break out.
3. The product of step 2 is thoroughly rinsed with deionized water.
4. The product of step 3 is etched by immersion in an aqueous solution containing $H_3PO_4$ (35 g/l OF 80% acid) and chromic acid (20 g/l $CrO_3$), at 40° C. for 2.5 minutes.
5. The product of step 4 is anodized under the conditions of step 2.
6. The product of step 5 is thoroughly washed with deionized water.
7. The product of step 6 is annealed at about 500° C. in a flow of hot air, for about 2 minutes. and further anodized for about 2 minutes under previously stated conditions.
8. The product of step 7 is anodized under the conditions of step 2 for about 2 minutes.
9. The product of step 8 is thoroughly washed with deionized water, and dried in a flow of hot air.

The thus-treated foil may be utilized in a printing plate as set forth in Example 1, above.

In a variation, etching step 4 may be carried out by immersing the product of step 3 in an 0.1M aqueous solution of oxalic acid at 60° C. for about 7 minutes.

In this Example, and in Example 4, it is to be understood that the procedure is carried out in a continuous manner by passage of Al foil in roll form from one step to the next step.

EXAMPLE 4

This is carried out as in Example 3, except that steps 2-4 are replaced by the following procedure (virtually simultaneous initial anodization and etching). The product of step 1 is immersed in a single bath containing an aqueous solution which is 0.83M in respect of ammonium adipate and 0.14M in respect of oxalic acid. Current density, temperature and time of this operation are as stated in step 2 of Example 1. The foil is thoroughly rinsed with deionized water, following which the operations described in steps 5-9 of Example I are carried out.

The thus-treated foil may be utilized in a printing plate as set forth in Example 1, above.

EXAMPLE 5

Determination of Pore Volume Enlargement

Two identical samples of VD foils NN 464/1/11/1 and 464/1/11/2 based on an Al foil substrate of thickness 63 µm and whole area 12.38 cm², were coated on both sides by $Al/Al_2O_3$ of thickness 20 µm each side, as described in U.S. Pat. No. 6,287,673. The area of each coated surface was 11.91 cm². Both samples were formed (anodized) for 10 minutes in an ammonium adipate solution at forming voltage 21 volts, forming current 0.5 A, and electrolyte temperature 85° C. The area of samples, so anodized was 10 cm². The samples were then washed with deionized water, dried and weighed.

In order to compare pore volumes, the second sample prior to final anodization was etched in an oxalic acid solution 0.3M at 60° C. during 15 minutes, and then anodized, washed, dried and weighed, as above.

The samples were now immersed in heated oil (TKO-19+) at 100° C., with a specific gravity 0.87 g/cm³. Excess oil was carefully removed, and both samples were weighed. It is believed that substantially all pores were filled entirely by the heated oil.

Calculations

The first (non-etched) foil sample was found to have absorbed 8.9 mg oil, i.e. 8.9/0.87=10.22 mm$^3$. oil, distributed on an area of 11.91 cm$^2$. Therefore the oil volume absorbed on the anodized area of the sample (10 cm$^2$) is 10.22×10/11.91=8.58 mm$^3$. Reduction of the pore volume caused by anodization is related to an estimated wall thickness difference of 15 nm, and is approximately 5.55 mm$^3$, so that the pore volume before anodization was equal to 5.55+8.58=14.13 mm$^3$. Because the volume of coating under treatment (for two sides of substrate) is approximately 40 mm$^3$, the degree of porosity of the initial sample is 100× 14.13/40=35.3%

Similar evaluation of the porosity of the second (etched and anodized) foil sample, which was found to have absorbed 19.65$^3$ mm oil, affords an estimated 41.2% porosity.

EXAMPLE 6

In this example, vacuum deposition of alumina was carried out, as an external porous coating on a primary aluminum/aluminum oxide VD coating on an aluminum foil substrate (by the method described in Example 2, above), intended as a method for increasing the surface area. The alumina deposition was obtained by vacuum evaporation of pure aluminum in a reactive atmosphere of pure oxygen, or a gas mixture containing oxygen, with the purpose of totally oxidizing deposited aluminum in the course of the deposition process (compare Example 1). Further details are shown in the Tables below.

Series 1-4

| Stage I deposition | | | | |
|---|---|---|---|---|
| Foil substrate thickness, μm | 32 | 32 | 32 | 32 |
| Type of inner black coating | Al/Al$_2$O$_3$ | Al/Al$_2$O$_3$ | Al/Al$_2$O$_3$ | Al/Al$_2$O$_3$ |
| Sample area, cm$^2$ | 5 | 5 | 5 | 5 |
| Coating thickness, μm | 7.75 | 7.75 | 7.75 | 8.05 |
| Condensation rate, Å/sec | 360 | 360 | 360 | 360 |
| Oxygen flow, cc/min | 75/135 | 75/135 | 75/135 | 75/135 |
| Oxygen pressure, mTorr | 0.01–0.03 | 0.01–0.03 | 0.01–0.03 | 0.01–0.03 |
| Argon pressure, mTorr | 4.5–5 | 4.5–5 | 4.5–5 | 4.5–5 |
| Substrate velocity, cm/sec | 65 | 65 | 65 | 65 |
| Substrate temperature, °C. | 250–280 | 250–280 | 250–280 | 250–280 |
| Stage II deposition | | | | |
| Alumina thickness, μm | 2.5 | 3 | 2.5 | 2.2 |
| Condensation rate, Å/sec | 525 | 525 | 525 | 525 |
| Oxygen flow, cc/min | 198 | 148 | 185 | 185 |
| Oxygen pressure, mTorr | | | | |
| Argon pressure, mTorr | 0 | 1.72 | | |
| Substrate velocity, cm/sec | 0 | 0 | 0 | 0 |
| Substrate temperature, °C. | 290 | 290 | 290 | 290 |

Series 5-8

| Stage I deposition | | | | |
|---|---|---|---|---|
| Foil substrate thickness, μm | 32 | 32 | 32 | 32 |
| Type of inner coating | Al/Al$_2$O$_3$ | Al/Al$_2$O$_3$ | Al/Al$_2$O$_3$ | Al/Al$_2$O$_3$ |
| Samples area, cm$^2$ | 5 | 5 | 5 | 5 |
| Coating thickness, μm | 4.5 | 4.25 | 4 | 4 |
| Condensation rate, Å/sec | 380/385 | 380/385 | 380/385 | 380/385 |
| Oxygen flow, cc/min | 160 | 160 | 160 | 160 |
| Oxygen pressure, mTorr, | 0.025/0.04 | 0.025/0.04 | 0.025/0.04 | 0.025/0.04 |
| Argon pressure, mTorr | 5.2 | 5.2 | 5.2 | 5.2 |
| Substrate velocity, cm/sec | 9 | 9 | 9 | 9 |
| Substrate temperature, °C. | 250 | 250 | 250 | 250 |
| Stage II deposition | | | | |
| Alumina thickness, μm | 2 | 2 | 2 | 2 |
| Condensation rate, Å/sec | 530 | 530 | 530 | 530 |
| Oxygen flow, cc/min | 380/410 | 380/410 | 380/410 | 380/410 |
| Oxygen pressure, mTorr | 1.00 | 1.00 | 1.00 | 1.00 |
| Argon pressure, mTorr | 2.3 | 2.3 | 2.3 | 2.3 |
| Substrate velocity, cm/sec | 25 | 25 | 25 | 25 |
| Substrate temperature, °C. | 210 | 210 | 210 | 210 |

Mechanical properties of manufactured samples were investigated in accordance with conventional requirements, to check the adhesion of upper alumina coating to lower sub-layer, and the total coating adhesion to the foil substrate body. For all of the samples, there was found to be good adhesion, which satisfies standard requirements, including the adhesive tape test and the bending test.

The thus-treated foil may be utilized in a printing plate as set forth in Example 1, above.

EXAMPLE 7

Vacuum Deposition of Porous Chromium

In this example (see Series 1-12, below), a porous chromium coating is vacuum deposited on at least one surface of an aluminum foil (similar to those described in previous examples), utilizing a deposition rate of about 1.5-10 Å/sec and a nitrogen atmosphere with internal pressure 2-5 mTorr, and a substrate temperature 350-400° C., preferably 360-380° C.

Vacuum deposition was carried out on rectangular test samples of aluminum foil of 99.99% purity, as substrate of thickness 32 μm, under the stated conditions. The substrates were heated by gas-discharge lamps during the deposition process.

An embodiment is also shown (see Series 13-16, below) in which an integral alumina layer is superimposed on the porous chromium cathode coating. This may be carried out by vapor deposition of e.g. Al at a deposition rate of about 120-620 Å per second, preferably 400-500 Å/sec and an essentially pure oxygen atmosphere at a pressure of 1-2 mTorr, preferably 1.0-1.4 mTorr, or O$_2$/Ar gas mixture with oxygen partial pressure near 1 mTorr and argon pressure 1.3-2.3 mTorr, preferably 1.7-2 mTorr and with a substrate temperature 200-350° C., preferably 250-300° C.

The oxygen pressure in Series 1-12 was 0.15 mTorr.

Series 1-6

| Number: | 01 | 02 | 03 | 04 | 05 | 06 | Units |
|---|---|---|---|---|---|---|---|
| Area: | 5 | 5 | 5 | 5 | 5 | 5 | cm$^2$ |
| Sides coated: | 2 | 1 | 1 | 2 | 2 | 2 | |
| Condensation rate: | 3.5-9 | 1.5-4.8 | 1.5-4.8 | 2.5-8 | 2.5-8 | 2.5-8 | Å/sec |
| N$_2$ pressure: | 2.25 | 2.65 | 2.65 | 3.45 | 3.45 | 3.45 | mTorr |
| Foil temp: | 370 | 365 | 365 | 370 | 370 | 370 | °C. |
| Coating thickness: | 1.25 | 1.2 | 1.2 | 2 | 2.5 | 1.25 | μm |

Series 7-12

| Number: | 07 | 08 | 09 | 10 | 11 | 12 | Units |
|---|---|---|---|---|---|---|---|
| Area: | 5 | 5 | 5 | 5 | 5 | 5 | cm$^2$ |
| Sides coated: | 2 | 2 | 1 | 1 | 2 | 2 | |
| Condensation rate: | 2.5-8 | 2.5-8 | 2-7 | 2-7 | 2-7 | 3-8 | Å/sec |
| N$_2$ pressure: | 3.45 | 3.45 | 5 | 5 | 5 | 4.6 | mTorr |
| Foil temp: | 370 | 370 | 374 | 374 | 374 | 365 | °C. |
| Coating thickness: | 2.75 | 2.5 | 2 | 2.5 | 2 | 0.75 | μm |

Analysis of Chromium Coating Samples

Samples of the chromium coating obtained in accordance with the above Series 1-12 were subjected to Energy Dispersive X-ray Spectroscopy (EDS) with the following results:

|  | Sample 1 | | Sample 2 | | Sample 3 | |
|---|---|---|---|---|---|---|
|  | wt. % | atomic % | wt. % | atomic % | wt. % | atomic % |
| Carbon | 2.44 | 7.08 | 2.31 | 6.84 | 2.09 | 6.24 |
| Oxygen | 17.37 | 37.81 | 16.44 | 36.49 | 16.12 | 36.15 |
| Aluminum | 2.00 | 2.58 | 1.44 | 1.90 | 1.50 | 2.00 |
| Silicon | 0.25 | 0.32 | 0.27 | 0.34 | 0.22 | 0.29 |
| Calcium | — | — | 0.41 | 0.36 | 0.33 | 0.30 |
| Chromium | 77.94 | 52.22 | 79.13 | 54.07 | 79.74 | 55.03 |
| Totals | 100.00 | 100.01 | 100.00 | 100.00 | 100.00 | 100.01 |

Additionally, it was determined that the above samples may contain nitrogen (<0.5%). The above data indicates that the sampled chromium coating contains a major proportion of a mixture of elemental Cr and $Cr_2O_3$ (mostly elemental Cr), together with small amounts of the following elements in oxidized form, namely, aluminum, silicon and possibly calcium, together with some $CO_2$ and possibly also $N_2$.

Series 13-16

This series illustrates the embodiment in which an integral alumna layer is superimposed on the porous chromium cathode coating.

| Stage I deposition | | | | |
|---|---|---|---|---|
| Foil substrate thickness, μm | 64 | 64 | 64 | 64 |
| Type of inner coating | Chromium | Chromium | Chromium | Chromium |
| Samples area, cm$^2$ | 5 | 5 | 5 | 5 |
| Coating thickness, μm | 2.32 | 1.77 | 0.96 | 2.32 |
| Condensation rate, Å/sec | 3–9 | 3–8 | 3–9 | 3–8 |
| Oxygen flow, cc/min | 0 | 0 | 0 | 0 |
| Oxygen pressure, mTorr | 2 × 10$^{-4}$ | 2 × 10$^{-4}$ | 2 × 10$^{-4}$ | 2 × 10$^{-4}$ |
| Nitrogen pressure, mTorr | 3.5 | 3.5 | 3.5 | 3.5 |
| Substrate velocity, cm/sec | 0 | 0 | 0 | 0 |
| Substrate temperature, °C. | 360 | 365 | 360 | 365 |
| Stage II deposition | | | | |
| Alumina thickness, μm | 4.1 | 3.9 | 5.5 | 4.1 |
| Condensation rate, Å/sec | 120–60 | 120–60 | 120–60 | 120–60 |
| Oxygen flow, cc/min | 96 | 92 | 88 | 96 |
| Oxygen pressure, mTorr | 1.20 | 1.20 | 1.20 | 1.20 |
| Argon pressure, mTorr | 2.00 | 1.30 | 1.30 | 2.00 |
| Substrate velocity, cm/sec | 0 | 0 | 0 | 0 |
| Substrate temperature, °C. | 295 | 295 | 295 | 295 |

ADVANTAGES OF THE INVENTION

The principal advantages of the present invention are as follows:

1. Possibility of readily attaining very high absorbance of IR radiation (at least ~65%, e.g., 70-90%), of the plate prior to application of the image recording layer, compared with conventional absorbance of prior art plates of less than 50%. This property could be particularly useful in IR image recording, when better contrast may be achieved.

2. Adjustable thermal conductivity is obtainable by controlling the porosity and/or changing the metal/oxide ratio in porous coating (b). High porosity, as well as a relatively high or substantially 100% oxide content, can provide desirable low conductivity.

3. The plates are manufactured by an ecology-friendly procedure, not involving undesirable chemicals such as HCl.

4. Possibility of economically advantageous manufacture by depositing both the porous coating and the hydrophilic layer in the same vacuum deposition apparatus, instead of forming the oxide (hydrophilic) layer by anodization.

5. Possibility of recycling, i.e. the porous coating can be removed chemically or mechanically, prior to re-using the substrate; this may be contrasted with conventional plates which have low bending strength and are liable to cracking, and thus are unlikely to be re-used.

6. The pore size in the porous coating can be adjusted within a wide range.

7. A variety of substrates including stainless steel and plastics such as polyimide (e.g. kapton) or polyamide (e.g. kapron), as well as scrap alloys, may possibly be utilized as substrates. Utilization of scrap alloys would have the added advantage of being environment-friendly.

8. Vapor deposited materials may include e.g. copper or chromium.

9. Possibility of obtaining layer (c), as defined herein, by vapor deposition, of sufficient hydrophilicity, such that an additional treatment step or steps to render the deposited layer more hydrophilic before applying the image recording layer would be obviated.

While the invention has been described with respect to specific embodiments including presently preferred modes of carrying out the invention, those skilled in the art will appreciate that there are numerous variations and permutations of the above described printing plates and techniques that fall within the spirit and scope of the invention.

The invention claimed is:

1. A printing plate which comprises in the stated sequence:
a substantially planar ungrained metallic substrate selected from aluminum, aluminum alloy, chromium and stainless steel substrates,
a non-anodic inorganic porous vacuum deposited ungrained coating, having a thickness within the range of 0.2 to 30 microns and consisting of an oxide of aluminum, and
an image recording layer,
provided that said porous coating comprises pores having widths within the range of from 1 to 30 nm.

2. A printing plate according to claim 1, which is further characterized by at least one of the following features, namely:
said coating has an at least 65% absorbance to infrared radiation; said plate comprises additionally an organic undercoat layer located between said coating and said image recording layer;
said image recording layer includes a polymeric matrix; said image recording layer includes ink-receptive and water-repellent copper.

3. A printing plate which comprises in the stated sequence:
(a) a substantially planar ungrained metallic substrate selected from aluminum, aluminum alloy, chromium and stainless steel substrates;
(b) a non-anodic inorganic porous vacuum deposited ungrained coating, having a thickness within the range of 0.2 to 30 microns and consisting of an oxide of aluminum,
(c) a hydrophilic layer; and
(d) an image recording layer,
provided that said porous coating comprises pores having widths within the range of from 1 to 30 nm.

4. A printing plate according to claim 3, wherein layer (c) is an anodic metal oxide layer or a vacuum deposited layer.

5. A printing plate according to claim 3, which is further characterized by at least one of the following features:
(i) layer (c) is selected from hydrophilic metal layers and hydrophilic metal oxide layers;
(ii) said substrate is selected from aluminum and aluminum alloy substrates;
(iii) said plate comprises additionally an organic undercoat layer located between said coating and said image recording layer;
(iv) said image recording layer includes a polymeric matrix;
(v) said image recording layer includes ink-receptive and water-repellent copper.

6. A printing plate according to claim 5, which is further characterized by at least one of the following features:
(i) layer (c) is selected from hydrophilic metallic copper and hydrophilic valve metal oxide layers;
(ii) said substrate is selected from supported aluminum and aluminum alloy foils.

7. A printing plate according to claim 6, which is further characterized by at least one of the following features:

(i) coating (b) has a fractal surface structure;
(ii) layer (c) is selected from anodic and non-anodic valve metal oxide layers;
(iii) said substrate is selected from aluminum and aluminum alloy foils supported by a metal or polymeric support.

8. A printing plate according to any one of claims 1 to 3, wherein said substrate is selected from aluminum and aluminum alloy foils adhered to a disposable or re-usable base support selected from metallic and polymeric supports.

9. A printing plate which comprises in the stated sequence:
a substantially planar ungrained metallic substrate selected from aluminum, aluminum alloy, chromium and stainless steel substrates,
a non-anodic inorganic porous vacuum deposited ungrained coating, having a thickness within the range of 0.2 to 30 microns and consisting of an oxide of aluminum, and an image,
provided that said porous coating comprises pores having widths within the range of from 1 to 30 nm.

10. A printing plate which comprises in the stated sequence:
(a) a substantially planar ungrained metallic substrate selected from aluminum, aluminum alloy, chromium and stainless steel substrates;
(b) a non-anodic inorganic porous vacuum deposited ungrained coating, having a thickness within the range of 0.2 to 30 microns and consisting of an oxide of aluminum,
(c) a hydrophilic layer; and
(d) an image,
provided that said porous coating comprises pores having widths within the range of from 1 to 30 nm.

11. A printing plate which comprises in the stated sequence:
a substantially planar ungrained metallic substrate selected from aluminum, aluminum alloy, chromium and stainless steel substrates,
a non-anodic inorganic porous vacuum deposited ungrained coating, having a thickness within the range of 0.2 to 30 microns and comprising at least one metal in elemental form, in admixture with an oxide of aluminum, provided that said porous coating comprises pores having widths within the range of from 1 to 30 nm; and
an image recording layer.

12. A printing plate according to claim 11, which is further characterized by at least one of the following features, namely:
said coating has an at least 65% absorbance to infrared radiation;
said plate comprises additionally an organic undercoat layer located between said coating and said image recording layer;
said image recording layer includes a polymeric matrix;
said image recording layer includes ink-receptive and water-repellent copper.

13. A printing plate which comprises in the stated sequence:
(a) a substantially planar ungrained metallic substrate selected from aluminum, aluminum alloy, chromium and stainless steel substrates;
(b) a non-anodic inorganic porous vacuum deposited ungrained coating, having a thickness within the range of 0.2 to 30 microns and comprising at least one metal in elemental form;

(c) a hydrophilic layer comprising an oxide of aluminum, said layer comprises pores having widths within the range of from 1 to 30 nm; and
(d) an image recording layer.

14. A printing plate according to claim 13, wherein at least one of the following features applies:
   coating (b) has an at least 65% absorbance to infrared radiation;
   layer (c) is an anodic metal oxide layer or a vacuum deposited layer;
   said ungrained coating comprises at least one metallic element in admixture with at least one metal oxide.

15. A printing plate according to claim 13, which is further characterized by at least one of the following features:
   (i) coating (b) comprises at least one member of the group consisting of ($\alpha$) and ($\beta$), namely:
      (a) valve metals and chromium, and
      (b) admixtures of at least one metal selected from valve metal and chromium, with at least one oxide selected from oxides of valve metal and chromium;
   (ii) layer (c) is selected from hydrophilic metal layers and hydrophilic metal oxide layers;
   (iii) said substrate is selected from aluminum and aluminum alloy substrates;
   (iv) said plate comprises additionally an organic undercoat layer located between said coating and said image recording layer;
   (v) said image recording layer includes a polymeric matrix;
   (vi) said image recording layer includes ink-receptive and water-repellent copper.

16. A printing plate according to claim 15, which is further characterized by at least one of the following features:
   (i) coating (b) comprises an admixture of at least one valve metal selected with at least one valve metal oxide;
   (ii) layer (c) is selected from hydrophilic metallic copper and hydrophilic valve metal oxide layers;
   (iii) said substrate is selected from supported aluminum and aluminum alloy foils.

17. A printing plate according to claim 16, which is further characterized by at least one of the following features:
   (i) coating (b) has a fractal surface structure;
   (ii) layer (c) is selected from anodic and non-anodic valve metal oxide layers;
   (iii) said substrate is selected from aluminum and aluminum alloy foils supported by a metal or polymeric support.

18. A printing plate according to claim 15, which is characterized by the fact that in coating (b), said metals and metal oxides are selected from valve metals and chromium and their oxides, provided that coating (b) does not consist of 100% metal, and that at least one of (b) and (c) has an at least 65% absorbance to infrared radiation.

19. A printing plate according to claim 18, wherein said substrate is selected from aluminum and aluminum alloy substrates.

20. A printing plate according to claim 18, which is further characterized by at least one of the following features:
   (i) coating (b) comprises an admixture of at least one valve metal with at least one valve metal oxide;
   (ii) layer (c) is selected from hydrophilic metallic copper and hydrophilic valve metal oxide layers;
   (iii) said substrate is selected from supported aluminum and aluminum alloy foils.

21. A printing plate according to claim 18, which is further characterized by at least one of the following features:
   (i) coating (b) comprises an admixture of at least one valve metal with at least one valve metal oxide;
   (ii) layer (c) is selected from hydrophilic metallic copper and hydrophilic valve metal oxide layers;
   (iii) said substrate is selected from supported aluminum and aluminum alloy foils.

22. A printing plate according to claim 20, which is further characterized by at least one of the following features:
   (i) coating (b) has a fractal surface structure;
   (ii) layer (c) is selected from anodic and non-anodic valve metal oxide layers;
   (iii) said substrate is selected from aluminum and aluminum alloy foils supported by a metal or polymeric support.

23. A printing plate according to any one of claims 11 to 13, wherein said substrate is selected from aluminum and aluminum alloy foils adhered to a disposable or re-usable base support selected from metallic and polymeric supports.

24. A printing plate which comprises in the stated sequence:
   a substantially planar ungrained metallic substrate selected from aluminum, aluminum alloy, chromium and stainless steel substrates,
   a non-anodic inorganic porous vacuum deposited ungrained coating, having a thickness within the range of 0.2 to 30 microns and comprising at least one metal in elemental form in admixture with an oxide of aluminum, provided that said porous coating comprises pores having widths within the range of from 1 to 30 nm, and
   an image.

25. A printing plate which comprises in the stated sequence:
   (a) a substantially planar ungrained metallic substrate selected from aluminum, aluminum alloy, chromium and stainless steel substrates;
   (b) a non-anodic inorganic porous vacuum deposited ungrained coating, having a thickness within the range of 0.2 to 30 microns and comprising at least one metal in elemental form;
   (c) a hydrophilic layer comprising an oxide of aluminum, said layer comprises pores having widths within the range of from 1 to 30 nm; and
   (d) an image.

* * * * *